United States Patent
Meierling et al.

(10) Patent No.: US 10,528,142 B2
(45) Date of Patent: Jan. 7, 2020

(54) METHOD FOR CONTROLLING AN OPERATING DEVICE FOR A TRANSPORTATION VEHICLE AND OPERATING DEVICE

(71) Applicant: VOLKSWAGEN AKTIENGESELLSCHAFT, Wolfsburg (DE)

(72) Inventors: Klaus Meierling, Bochum (DE); Niels Petter, Essen (DE)

(73) Assignee: Volkswagen Aktiengesellschaft (DE)

( * ) Notice: Subject to any disclaimer, the term of this patent is extended or adjusted under 35 U.S.C. 154(b) by 0 days.

(21) Appl. No.: 16/199,377

(22) Filed: Nov. 26, 2018

(65) Prior Publication Data

US 2019/0163276 A1   May 30, 2019

(30) Foreign Application Priority Data

Nov. 27, 2017 (DE) .......................... 10 2017 221 121

(51) Int. Cl.
*G06F 3/01*  (2006.01)
*H01H 13/85*  (2006.01)
(Continued)

(52) U.S. Cl.
CPC .............. *G06F 3/016* (2013.01); *B60K 37/06* (2013.01); *G06F 3/0416* (2013.01);
(Continued)

(58) Field of Classification Search
CPC .. G06F 3/016; H01H 13/85; H01H 2003/008; H01H 2215/004; H01H 2215/052; H01L 41/09; B60K 2370/143
(Continued)

(56) References Cited

U.S. PATENT DOCUMENTS 6,700,508 B1 * 3/2004 Nomura ............... H01H 13/702
                                                     341/22
8,853,916 B2 * 10/2014 Browne .................. G05G 1/02
                                                     310/328
(Continued)

FOREIGN PATENT DOCUMENTS

DE   112005002107 T5   10/2007
DE   102008055865 A1    5/2010
(Continued)

OTHER PUBLICATIONS

Search Report for German Patent Application No. 10 2017 221 121.0; dated Sep. 21, 2018.

*Primary Examiner* — John A Tweel, Jr.
(74) *Attorney, Agent, or Firm* — Barnes & Thornburg LLP

(57) ABSTRACT

A method for actuating a control device for a transportation vehicle with a control element. A spring-elastic element is disposed underneath the control element and is indirectly or directly moved and/or deformed by a piezo element to give an operator at least a haptic feedback during the operation of the control element. The spring-elastic element is moved toward the control element when the piezo element is actuated and is brought into working contact with the control element. This enables the spring-elastic element to be transferred from a stable initial position into an unstable deformation position when the control element is operated. When the control element is released, the spring-elastic element automatically passes from the deformation position back to the initial position. A haptic feedback is produced by the spring-elastic element in each case in response to a change from the initial position to the deformation position and vice versa.

16 Claims, 3 Drawing Sheets

(51) Int. Cl.
  *B60K 37/06* (2006.01)
  *G06F 3/041* (2006.01)
  *H01L 41/09* (2006.01)
  *H01H 3/00* (2006.01)

(52) U.S. Cl.
  CPC ............ *H01H 13/85* (2013.01); *H01L 41/09* (2013.01); *B60K 2370/143* (2019.05); *H01H 2003/008* (2013.01); *H01H 2215/004* (2013.01); *H01H 2215/052* (2013.01)

(58) Field of Classification Search
  USPC ....................................................... 340/407.2
  See application file for complete search history.

(56) References Cited

U.S. PATENT DOCUMENTS

| | | | |
|---|---|---|---|
| 9,182,825 B2 * | 11/2015 | Schneider | G06F 3/041 |
| 10,109,782 B2 * | 10/2018 | Ohta | H01L 41/0471 |
| 2009/0002328 A1 | 1/2009 | Ullrich et al. | |
| 2013/0141564 A1 * | 6/2013 | Miyazawa | H01L 41/09 |
| | | | 348/126 |
| 2014/0125470 A1 | 5/2014 | Rosenberg | |

FOREIGN PATENT DOCUMENTS

| | | |
|---|---|---|
| DE | 102011106051 A1 | 1/2013 |
| DE | 102013001598 A1 | 7/2014 |
| DE | 102016200444 A1 | 9/2016 |
| DE | 102015007822 A1 | 12/2016 |
| DE | 102015015417 A1 | 6/2017 |

* cited by examiner

METHOD FOR CONTROLLING AN OPERATING DEVICE FOR A TRANSPORTATION VEHICLE AND OPERATING DEVICE

PRIORITY CLAIM

This patent application claims priority to German Patent Application No. 10 2017 221 121.0, filed 27 Nov. 2017, the disclosure of which is incorporated herein by reference in its entirety.

SUMMARY

Illustrative embodiments provide a method for actuating a control device for a transportation vehicle. Illustrative embodiments also provide a control device for carrying out the method.

DETAILED DESCRIPTION

Figure 1:
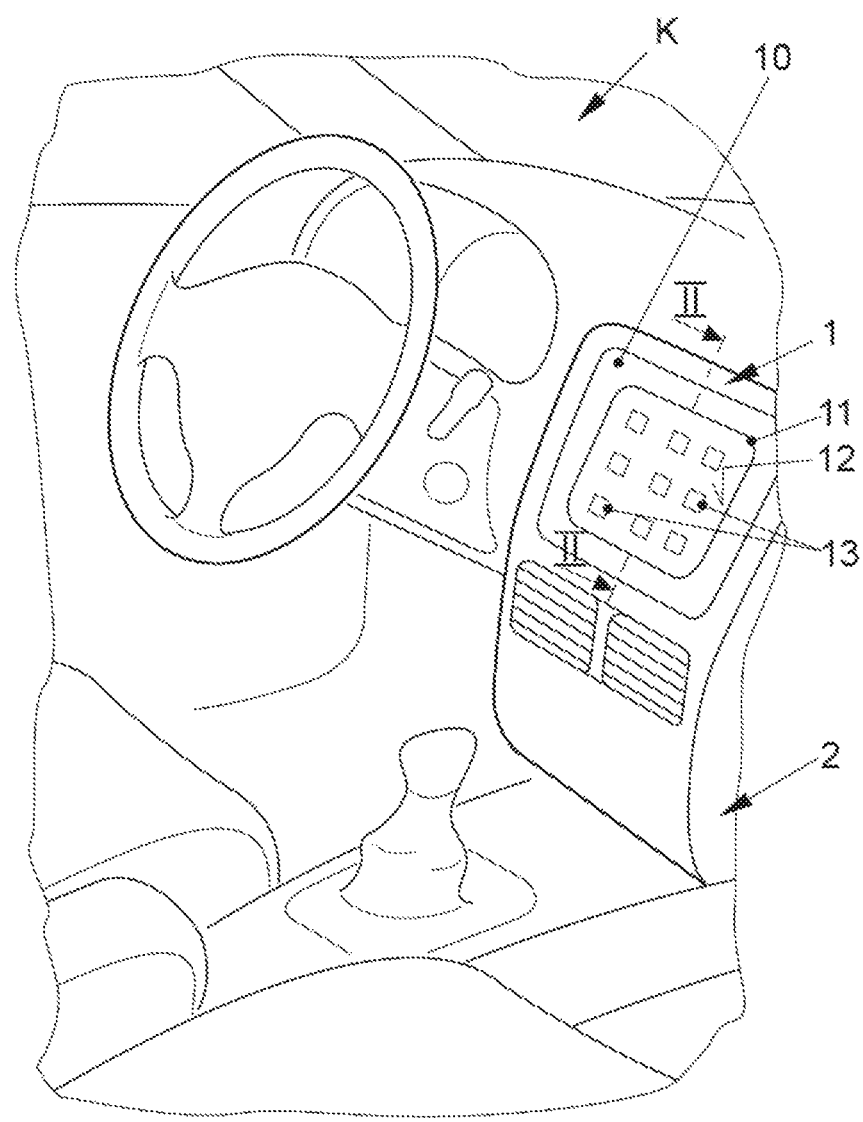
FIG. 1 shows schematically the representation of a control device in the front interior of a transportation vehicle.

The features of the preamble of the method and also of the preamble of the independent product claim arise from US2014/0125470 A1. Specifically, a control device is disclosed that comprises a control element with a control surface framed by a housing. A piezoelectric membrane is disposed underneath the control element and spaced apart by a spacer plate and is driven by an electrically actuated piezo element. Pre-loaded springs connect the control element to a floor of the housing and hold the element elastically in the initial position thereof. To output haptic feedback to an operator, the piezo element is electrically stimulated and the piezoelectric membrane is deformed. This is carried out in such a way that the control element carries out an oscillatory movement.

In DE 10 2015 007 822 A1, a control device with a control surface for a transportation vehicle is described, underneath which discrete deformation elements are disposed. The deformation elements can be moved out of the plane of the control surface using an electrically actuated shape memory alloy. As a result, elevations are formed on the control surface that give an operator haptic orientation on the control surface.

Finally, a control device for a transportation vehicle is also known from DE 10 2015 015 417 A1. The control element comprises a recess under a control surface, wherein a piezo element is disposed between the recess and the control surface. By electrical actuation, the piezo element can be deformed so as to cause a depression or a bulge in the control surface. This enables a perceptible haptic signal to be produced for an operator during an operation.

Starting from the present prior art, disclosed embodiments provide a method for actuating a control device for a transportation vehicle that reliably and simply enables the generation of haptic feedback when operating the control device.

Disclosed embodiments also provide a suitable control device for carrying out the method that is of a simple and inexpensive design.

Disclosed embodiments provide a method and a control device.

Disclosed embodiments provide a method for actuating a control device for a transportation vehicle. In this case, the control device comprises a control element, wherein a spring-elastic element disposed underneath the control element is indirectly or directly moved and/or deformed by a piezo element. This is carried out to give an operator at least one haptic feedback during the operation of the control element.

The disclosure now proposes that the spring-elastic element is moved towards the control element when the piezo element is actuated and is brought into working contact with the control element. This causes the spring-elastic element to be transferred from a stable initial position into an unstable deformation position when actuating the control element. When the control element is released the spring-elastic element automatically passes from the deformation position back to the initial position. During a change from the initial position to the deformation position and vice-versa, haptic feedback is produced by the spring-elastic element in each case.

The spring-elastic element may be moved translationally towards the control element when the piezo element is actuated. In this case, the haptic feedback arises during the transition from the initial position to the deformation position and vice-versa. Thus no oscillatory or vibrational haptic feedback is produced, but a simple singular haptic feedback. This enables the generation of a known operational feel, such as is customary from a computer keyboard or similar, for example.

According to at least one disclosed embodiment, it is proposed to detect whether an operator's control tool is approaching or touching a control surface of the control element. The piezo element is only actuated if an operator's control tool is approaching or touching the control surface. By the features, it is ensured that the piezo element is only energized if a haptic feedback may also be necessary. This results in a reduction in power consumption. Apart from that, the control device can only be actuated at all if the on-board electronics are switched on.

According to another disclosed embodiment, the position on the control surface of the control element at which an operator's control tool approaches the control surface or the position at which the control tool touches the control surface is detected. In this case, the piezo element is only actuated if an operator's control tool approaches or touches the control surface at defined positions on the control surface.

The exemplary embodiment of the method enables haptic feedback to be produced only if a defined control symbol on the control surface is also actually to be operated. If, for example, there is a plurality of symbols disposed on a larger control surface and an operator's control tool touches positions between the control symbols, then the piezo element is not actuated and the operator has the sensation that he is only touching a "dead", stiff control surface.

To also be able to give an operator a suitable audible feedback when operating the control device, it is proposed to additionally generate an acoustic, singular sound by the spring-elastic element during a change of the spring-elastic element from the initial position to the deformation position and vice-versa in each case. Thus, no continuous signal, such as, for example, a drone or a buzz, but a brief noise such as, for example, a crack or a click is produced. This fits very well with the described haptic feedback and constitutes a familiar noise for an operator.

As already mentioned, the disclosure also concerns a control device for carrying out the method. The control device is fitted with a control element that comprises a control surface. Furthermore, the control element is framed by a housing. Underneath the control element there is a spring-elastic element that can be indirectly or directly moved and/or deformed by a piezo element.

The control device is characterized in that the piezo element can be actuated such that the spring-elastic element is moved by the piezo element towards the control element and is brought into working contact with the control element. The movement of the piezo element towards the control element may be carried out translationally. By the working contact made, the spring-elastic element can be moved from a stable initial position to an unstable deformation position by operating, i.e., by pressing, the control element. From the unstable deformation position, the control element can automatically pass back to the initial position when released. In the event of a change from the initial position to the deformation position and vice-versa, haptic feedback can be produced by the spring-elastic element in each case.

The spring-elastic element may be made of metal. However, other materials such as, for example, plastic are conceivable.

A control device of this type is used for carrying out the disclosed method inexpensively and reliably. However, the control device can be implemented inexpensively if the spring-elastic element is a conventional crack disk. As a rule, conventional crack disks comprise a circular profile and the known "clicker properties" are very suitable for the present disclosure. This means that in the event of pressure on the crack disk and overcoming a defined resistance forming haptic feedback, the crack disk collapses while outputting a crackling sound. After the pressure is released, the crack disk also returns to the initial position thereof while outputting a crackling sound and generating haptic feedback.

To make the pressure point for the spring-elastic element reproducible as accurately as possible, it is very beneficial if the spring-elastic element is guided by at least one wall of the housing in the direction of the central axis thereof, i.e., in the direction of the translational movement thereof.

To prevent tilting of the control element in the event of pressure on a control symbol outside the center of the control element or even on the edge thereof, according to another disclosed embodiment, it is proposed that the control element is guided by at least one wall of the housing in the actuation direction thereof. If, for example, the control element has a circular profile shape, then the wall of the housing can enclose the entire profile of the control element. In the case of a rectangular control element outline, the guidance can be carried out at least on two parallel outer sides of the control element. Other different solutions for achieving freedom from tilting are also conceivable.

According to another development, it is extremely beneficial if the control surface of the control element is embodied as a proximity-sensitive and/or contact-sensitive surface. In this case, an analysis and control device is provided that can detect the position at which an operator's control tool approaches the control surface or at which the control tool touches the control surface.

In this way it can be ensured that switching of the control element or the generation of haptic and/or audible feedback is only possible if a defined control symbol on the control surface of the control element is touched or approached.

In this context, it is very conducive to easy operability if a plurality of operating symbols is disposed on the control surface and the control surface is embodied as a continuous, optionally planar, surface. The term "control symbol" shall also mean numerals, letters, pictograms and similar.

Finally, a transportation vehicle that comprises at least one disclosed control device shall also be placed under protection with the disclosure.

An exemplary embodiment is represented in the figures and is described in detail in the following description using the figures. As a result, yet more benefits of the disclosed embodiments are revealed. The same letters, even in different figures, refer to the same, comparable or functionally equivalent components. In this case, corresponding or comparable properties and benefits are achieved, even if a repeated description of or reference thereto is not carried out. The figures are not always true to scale. In some figures proportions can be shown exaggerated to be able to highlight features of an exemplary embodiment more clearly.

We refer first to FIG. 1. In this figure, the interior of a transportation vehicle K in the region of the center console 2 thereof is represented.

It can be seen that a control device 1 is disposed in the region of the center console 2. The control device 1 comprises an actuatable, especially depressible, control element 11 that is enclosed or framed by a housing 10. A plurality of operating symbols 13 is disposed on a control surface 12 of the control element 11.

When operating the control element 11 by touching one of the operating symbols 13 and pressing the control element 11, it is desired that not only the corresponding function underlying the control symbol 13 is carried out, but also a haptic and/or even audible feedback about the operation that is carried out is fed back to the operator.

Figure 2A:
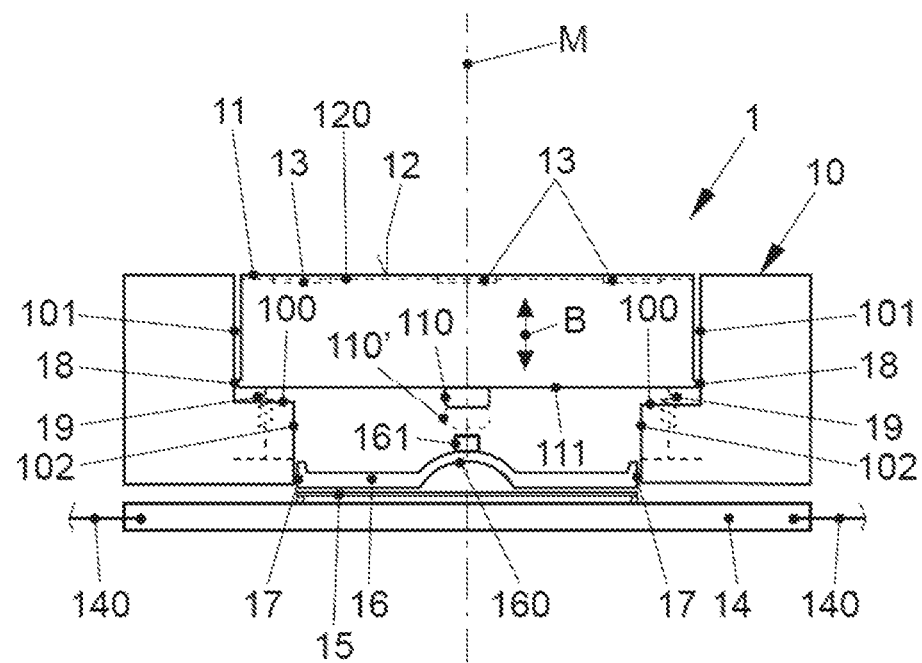
FIG. 2a shows schematically a view according to the sectional profile II of FIG. 1, rotated in the horizontal, in a first operating state.

The control device 1 is specially embodied for this purpose, as is now described in detail using FIG. 2. Thus in FIG. 2a, which represents a cross-section through the control device 1, a first operating state of the control device 1 can be seen.

It can be seen that the control element 11 is laterally guided by walls 101 of the housing 10, especially being parallel-guided (see guides 18). In this way it is ensured that even in the case of an off-center operation of the control element 11, the control element does not tilt during a translational movement in the actuation direction B.

The operation of the control element 11 is carried out by pressing on the control surface 12 by a control tool (for example, a finger, which is not represented).

As a result, the control element 11, which may be embodied as a stable, essentially inflexible body, is displaced towards a spring-elastic element 16.

The spring-elastic element 16 is disposed directly underneath the control element 11. It is guided at two or more points by a wall 102 of the housing 10, especially parallel-guided (see guides 17).

Underneath the spring-elastic element 16 there is a deformation element 15, on which the spring-elastic element 16 rests. In the representation, only a small distance is left between the components for better readability.

The deformation element 15 is connected at the edge region or along the contour thereof to a piezo element 14 that is disposed underneath it.

Figure 5:
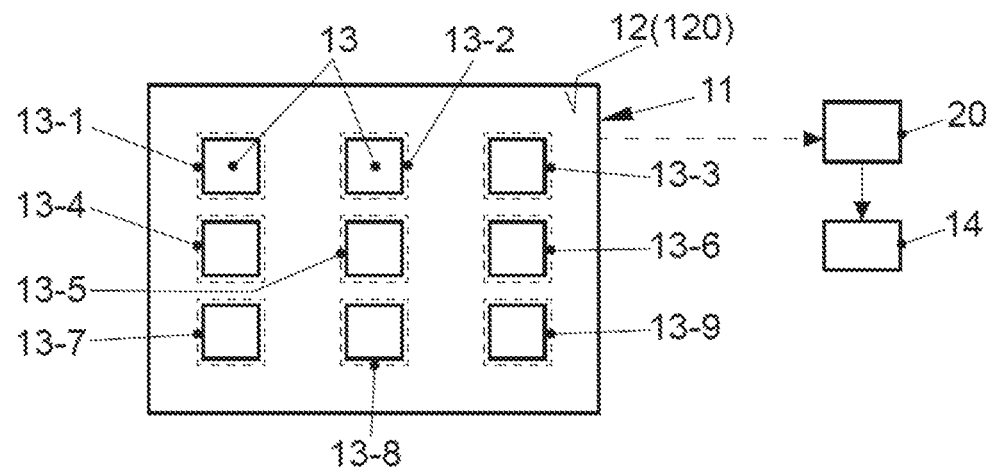
FIG. 5 shows schematically a top view of the control surface of the control element according to view III of FIG. 2b.

The piezo element 14 in turn is connected for signaling purposes via electrical connectors 140 to an analysis and control device 20 that is not represented here (see FIG. 5).

Spring elements 19, optionally helical compression springs, hold the control element 11 flexibly in the illustrated position.

If the control element 11 is actuated, i.e., depressed, in the illustrated operating state, then the control element 11 is pressed downwards in the actuation direction B thereof until an underside 111 of the control element 11 butts against a ledge 100 of the housing 10.

However, in the present operating state of the control device, when the control element 11 is depressed neither is a function triggered nor does the operator receive haptic or audible feedback about a completed operation of the control element 11.

Rather, an operator has the feeling of pressing against a rigid plate without any feedback. This is because when the underside 111 butts against the ledge 100 an underside contact element 110 is also shifted towards the spring-elastic element 16 (see number 110'), but does not pass into working contact with a present knob-like contact element 161 of the spring-elastic element 16.

Figure 2B:
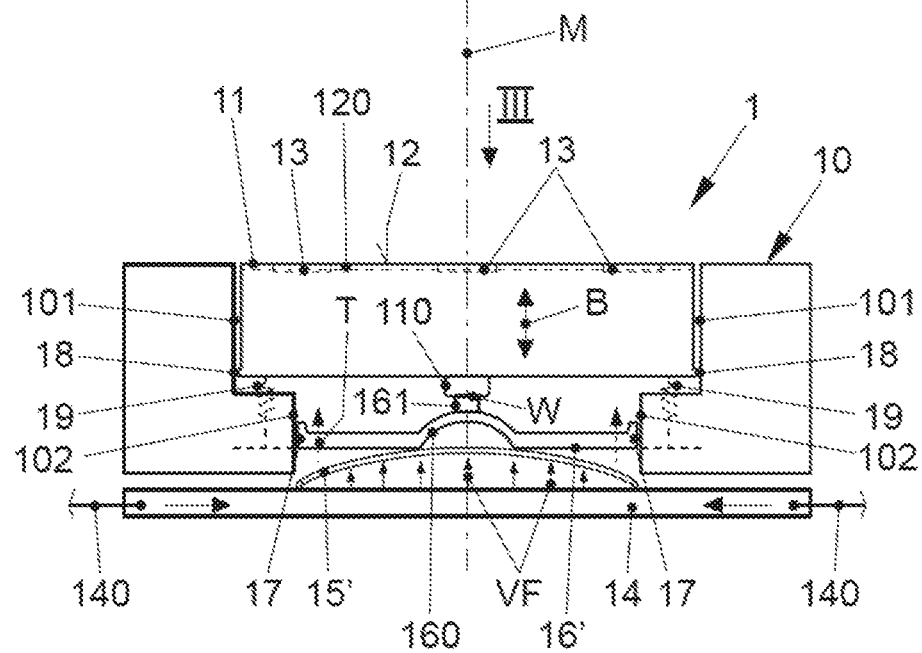
FIG. 2b shows schematically a representation comparable to FIG. 2a, in a second operating state.

The triggering of a defined function and the provision of a corresponding haptic and/or audible feedback is only possible if the control device 1 is "armed", as illustrated in FIG. 2b. Arming of the control device 1 is carried out depending on touching the control surface 12 at defined positions, which is detected using a proximity-sensitive and touch-sensitive layer 120 of the control surface 12. This is described in detail below.

If the conditions for arming of the control device 1 are present, then the piezo element 14 is correspondingly actuated via the electrical connectors 140. The result of this is that the piezo element 14 is compressed in the longitudinal direction thereof (see arrows). The consequence of this is a deformation of the deformation element 15 such that it is raised up concavely towards the spring-elastic element 16 (see deformation VF and position 15').

With the deformation VF of the deformation element 15, at the same time the spring-elastic element 16 is also moved upwards towards the control element 11 in as a translational movement T. The translational movement T is carried out until the contact element 161 of the spring-elastic element 16 and the contact element 110 of the control element 11 come together in a working contact W (see position 16'). Only then is the control device 1 armed. The arming can be carried out within very short time periods, optionally in the millisecond region.

Both the actuation direction B of the control element 11 and the translational movement T of the spring-elastic element 16 are carried out in the direction of a center point axis M, in the direction of which the mentioned guides 17 and 18 also act.

Figure 3:
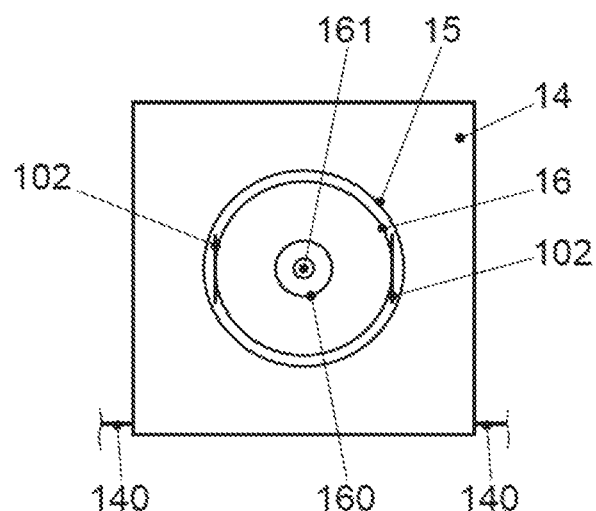
FIG. 3 shows schematically a view of the piezo element together with the spring-elastic element according to view III of FIG. 2b, in isolation.

As can be seen from FIGS. 2 and 3, the deformation element 15 and the spring-elastic element 16 may be embodied in a circular form. In contrast, the piezo element 14, to which the deformation element 15 is attached, is embodied in a rectangular form, optionally square. The deformation element 15 may be a thin plate and may be made of metal.

The spring-elastic element 16 is of a plate-shaped form with a raised peripheral edge region and a central bulge 160. The contact element 161 is disposed on the bulge 160 in the vicinity of the center point axis M.

If the control element 11 is now operated at the correct point in the armed state according to FIG. 2b, i.e., is depressed against the spring force of the springs 19, then the spring-elastic element 16 is transferred from the stable initial position thereof represented in FIG. 2a into an unstable deformation position, and in doing so triggers at least a haptic feedback to an operator.

When the control element 11 is released, the control element 11 passes back to the initial position thereof by the spring force of the spring elements 19. At the same time, the spring-elastic element 16 is automatically transferred back from the deformation position thereof to the initial position. Also, during this the operator again receives at least one haptic feedback, which is produced by the spring-elastic element 16.

Figure 4:
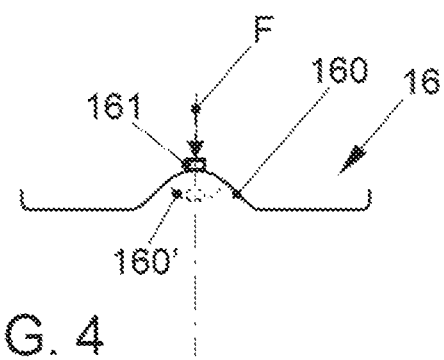
FIG. 4 shows schematically a lateral representation of the spring-elastic element in isolation, in two different operating states.

The two states of the spring-elastic element 16 mentioned will be briefly described once again using FIG. 4. The spring-elastic element 16, which may also be made of metal, is illustrated in isolation therein. The spring-elastic element 16 may be implemented as a conventional crack disk. The stable initial position of the spring-elastic element 16 is represented by the solid line. If an actuating force F is exerted on the contact element 161 in the initial position, then the spring-elastic element 16 passes into the region of the bulge 160 thereof in the mentioned unstable deformation position. The unstable deformation position is characterized by a depression 160' (shown dashed). In the event of a reduction or absence of the actuating force F, the depression 160' reverts to a bulge 160. In the event of a transition from one of the mentioned positions to another, a haptic feedback is carried out each time, and depending on the dimensions the output of an audible singular noise is also carried out. The noise may be a cracking or clicking noise.

Finally, the conditions in which the control device 1 is armed are described using FIG. 5.

The control surface 12, as already mentioned, is thus provided with a proximity-sensitive and touch-sensitive layer 120. By the layer 120, the position at which an operator's control tool approaches the control surface 12 can be detected or the position at which the control surface 12 is touched can be detected. Certain positions 13-1 to 13-9 or certain position ranges on the control surface 12 are thus associated with the control symbols 13.

If an approach to one of the positions or touching one of the positions takes place, then this is detected in a suitable manner and analyzed by an analysis and control device 20. The analysis and control device 20 thereupon actuates the piezo element 14 such that arming of the control device 1 is carried out in the described way.

If an approach to or touching of the control surface 12 is detected only at positions outside the positions 13-1 to 13-9, then no arming of the control device 1 is carried out. This remains "hard" when touched and does not impart a switching feel. No switching signal is produced or forwarded.

In contrast to the illustrated exemplary embodiment, it is conceivable that more or fewer of the operating symbols 13 can be disposed on the control surface 12. In any case, because of the guides 18 (cf. FIG. 2), tilt-free displacement of the control element 11 is carried out, regardless of where it is touched.

Furthermore, it is to be expected that the control surface 12 may be embodied as a continuous control surface. Thus, no gaps, slits or similar are provided between the individual control symbols 13. This enables the operating feel and also the insensitivity to fouling of the control device 1 to be improved. In this case, the control surface can be embodied in a planar form or even curved, for example, convex or concave.

REFERENCE CHARACTER LIST 1 control device
2 center console
10 housing
11 control element
12 control surface
13 operating symbols
13-1 through 13-9 positions on the control surface
14 piezo element
15, 15' deformation element
16, 16' spring-elastic element
17 guide
18 guide
19 spring elements
20 analysis and control device
100 ledge
101 wall
102 wall
110, 110' contact element
111 underside
120 proximity-sensitive and touch-sensitive layer
140 electrical connectors
160 bulge
160' depression
161 contact element
B actuation direction
F actuating force
K transportation vehicle
M center point axis
T translational movement
VF deformation
W working contact

The invention claimed is:

1. A control device for carrying out a method for actuating the control device for a transportation vehicle with a control element comprising:
  a spring-elastic element disposed underneath the control element is indirectly or directly moved and/or deformed by a piezo element to give an operator haptic feedback during operation of the control element,
  wherein the spring-elastic element is moved toward the control element when the piezo element is actuated and is brought into working contact with the control element, such that the spring-elastic element is transferred from a stable initial position into an unstable deformation position during operation of the control element and the spring-elastic element is automatically returned from the unstable deformation position to the stable initial position by releasing the control element, and
  the control device further comprises a housing enclosing the control element and including a control surface,
  wherein the spring-elastic element underneath the control element is moved and deformed by the piezo element,
  wherein the piezo element is actuated so the spring-elastic element is moved by the piezo element towards the control element and is brought into working contact with the control element and the spring-elastic element is transferred from the stable initial position into the unstable deformation position when the control element is operated, from which the control element automatically returns to the stable initial position when the control element is released, and
  wherein the haptic feedback is produced by the spring-elastic element in response to a change from the initial position to the deformation position and vice-versa.

2. The control device of claim 1, wherein that the spring-elastic element is a conventional crack disk.

3. The control device of claim 1, wherein that the spring-elastic element is guided in a direction of movement thereof by at least one wall of the housing.

4. The control device of claim 1, wherein the control element is guided in an actuation direction thereof by at least a wall of the housing.

5. The control device of claim 1, wherein the control surface of the control element is embodied as a proximity-sensitive and/or contact-sensitive surface and an analysis and control device is provided, by which a position at which a control tool of the operator approaches or touches the control surface is detected.

6. The control device of claim 5, wherein a plurality of operating symbols is disposed on the control surface and the control surface is embodied as a continuous surface.

7. A transportation vehicle with at least one control device comprising:
  a control element enclosed by a housing and which comprises a control surface
  a spring-elastic element disposed underneath the control element is indirectly or directly moved and/or deformed by a piezo element to give an operator at least one haptic feedback during the operation of the control element,
  wherein the spring-elastic element is moved toward the control element when the piezo element is actuated and is brought into working contact with the control element, such that the spring-elastic element is transferred from a stable initial position into an unstable deformation position by operation of the control element and the spring-elastic element automatically passes back from the deformation position to the initial position by release of the control element,
  the spring-elastic element underneath the control element is moved and/or deformed by the piezo element,
  the piezo element is actuated so the spring-elastic element is moved by the piezo element towards the control element and is brought into working contact with the control element and the spring-elastic element is transferred from the stable initial position into the unstable deformation position when the control element is operated, from which the control element automatically passes back to the initial position when the control element is released, and
  a haptic feedback is produced by the spring-elastic element in each case in response to a change from the initial position to the deformation position and vice-versa.

8. The transportation vehicle of claim 7, wherein that the spring-elastic element is a conventional crack disk.

9. The transportation vehicle of claim 7, wherein that the spring-elastic element is guided in a direction of movement thereof by at least one wall of the housing.

10. The transportation vehicle of claim 7, wherein the control element is guided in an actuation direction thereof by at least a wall of the housing.

11. The transportation vehicle of claim 7, wherein the control surface of the control element is embodied as a proximity-sensitive and/or contact-sensitive surface and an analysis and control device is provided, by which a position at which a control tool of the operator approaches or touches the control surface is detected.

12. The transportation vehicle of claim 11, wherein a plurality of operating symbols is disposed on the control surface and the control surface is embodied as a continuous surface.

13. A method for actuating a control device for a transportation vehicle with a control element comprising:
   indirectly or directly moving and/or deforming by a piezo element a spring-elastic element disposed underneath the control element to give an operator at least one haptic feedback during the operation of the control element,
   moving the spring-elastic element toward the control element when the piezo element is actuated and is brought into working contact with the control element, such that the spring-elastic element is transferred from a stable initial position into an unstable deformation position upon operating the control element and the spring-elastic element automatically passes back from the deformation position to the initial position on releasing the control element,
   wherein the control device comprises a control element enclosed by a housing and which includes a control surface,
   moving and/or deforming the spring-elastic element underneath the control element by a piezo element,
   actuating the piezo element so the spring-elastic element is moved by the piezo element towards the control element and is brought into working contact with the control element and the spring-elastic element is transferred from the stable initial position into the unstable deformation position when the control element is operated, from which the control element automatically passes back to the initial position when the control element is released, and
   producing the at least one haptic feedback by the spring-elastic element in each case in response to a change from the initial position to the deformation position and vice-versa.

14. The method of claim 13, wherein the piezo element is only actuated in response to an operator's control tool approaching or touching the control surface in response to detection of the operator's control tool approaching or touching the control surface of the control element.

15. The method of claim 13, wherein the piezo element is only actuated in response to an operator's control tool approaching or touching defined positions on the control surface in response to detection of a position on the control surface of the control element at which the operator's control tool approaches or at which the control tool touches.

16. The method of claim 13, wherein an audible singular noise is produced by the spring-elastic element in each case in response to the spring-elastic element changing from the initial position to the deformation position and vice-versa.

\* \* \* \* \*